United States Patent [19]

Vogel et al.

[11] Patent Number: 5,314,785
[45] Date of Patent: May 24, 1994

[54] PHOTOSENSITIVE MATERIALS

[75] Inventors: Dennis E. Vogel; John J. Stofko, Jr., both of St. Paul, Minn.

[73] Assignee: Minnesota Mining and Manufacturing Company, Saint Paul, Minn.

[21] Appl. No.: 34,696

[22] Filed: Mar. 19, 1993

Related U.S. Application Data

[63] Continuation of Ser. No. 817,528, Jan. 6, 1992, Pat. No. 5,225,316.

[51] Int. Cl.$^5$ .............................................. G03C 5/00
[52] U.S. Cl. .................................. 430/269; 430/270; 430/280
[58] Field of Search .................... 430/270, 280, 269; 522/31, 127, 154

[56]  References Cited

U.S. PATENT DOCUMENTS

| | | | |
|---|---|---|---|
| 4,101,323 | 7/1978 | Buhr et al. | 96/35 |
| 4,256,828 | 3/1981 | Smith | 430/280 |
| 4,708,925 | 11/1987 | Newman | 430/270 |
| 4,963,463 | 10/1990 | Koshiba et al. | 430/191 |
| 5,077,174 | 12/1991 | Bauer et al. | 430/270 |
| 5,085,972 | 2/1992 | Vogel | 430/270 |
| 5,102,771 | 4/1992 | Vogel et al. | 430/270 |
| 5,221,590 | 6/1993 | Bugner | 430/70 |

FOREIGN PATENT DOCUMENTS

| | | | |
|---|---|---|---|
| 672947 | 9/1962 | Canada | 401/61 |
| 0451736A2 | 6/1991 | European Pat. Off. | G03F 7/039 |
| 0451741A2 | 6/1991 | European Pat. Off. | G03F 7/039 |
| 53-094691 | 8/1978 | Japan | D06C 15/14 |
| 58-068743 | 4/1983 | Japan | G03C 1/72 |
| 62-299313 | 12/1987 | Japan | B29C 45/00 |
| 63-256492 | 10/1988 | Japan | B41N 1/08 |
| 63-317388 | 12/1988 | Japan | B41N 1/08 |
| 4-26850 | 5/1990 | Japan . | |
| WO91/15453 | 10/1991 | PCT Int'l Appl. | C07C 67/04 |
| WO91/15808 | 10/1991 | PCT Int'l Appl. | G03F 7/039 |
| WO91/15809 | 10/1991 | PCT Int'l Appl. | G03F 7/039 |
| WO91/15810 | 10/1991 | PCT Int'l Appl. | G03F 7/039 |

OTHER PUBLICATIONS

*Macromolecules*, H. Ito and M. Ueda, 1988, 21, pp. 1475-1482.
*Polym. Eng. Sci.*, H. Ito and C. G. Wilson, 1983, 30, p. 59.
*J. Imag. Sci.*, J. M. J. Frechet et al., 1986, 30, p. 59.
*Poly. Mater Sci. Eng.*, H. Ito, 1989, 60, p. 142.
*Proc. SPIE-Int. Soc. Opt. Eng.*, H. Ito and C. G. Willson, 1987, 771, pp. 24-27.
Abstract of *ACS Symp. Ser.*, H. Ito, M. Ueda, and M. Ebina, 1989, 412, pp. 57-73.

*Primary Examiner*—Steve Rosasco
*Attorney, Agent, or Firm*—Gary L. Griswold; Walter N. Kirn; Gregory A. Evearitt

[57] ABSTRACT

Photosensitive compositions containing a photoinitiator which generates an acid upon exposure to light and a polymer containing pendant alkoxy alkyl ester groups. Also disclosed are imageable articles containing the photosensitive compositions of the present invention coated on a substrate as well as processes for forming an imaged article.

9 Claims, No Drawings

PHOTOSENSITIVE MATERIALS

This is a continuation of application Ser. No. 07/817,528 filed Jan. 6, 1992, now U.S. Pat. No. 5,225,316.

FIELD OF THE INVENTION

This invention relates to photosensitive compositions. It also relates to imageable articles containing novel photosensitive compositions.

BACKGROUND OF THE INVENTION

Lithographic processes generally employ at least two steps to prepare a plate for use in a printing press, namely exposure of a plate coated with a photosensitive composition to a positive or negative light source to create a photoimage and a subsequent development step. Typically in a negative-acting system, the development step involves washing away material from the plate which was unexposed to the light source with the aid of a developer solution which may be highly alkaline, e.g. pH of 13, and based on an organic solvent. Alternatively, heating has sometimes been employed to effect development of the photoimage.

Both of the above-described development processes, though, suffer from the drawback of being relatively time-consuming and expensive in some instances. Furthermore, when volatile organic or strongly alkaline developer solutions are used, their disposal presents an environmental problem.

What have been needed in the industry, therefore, are photosensitive compositions which can be used in development processes which do not have the above-described drawbacks.

A variety of different materials have been used in photosensitive compositions in the past. Photosensitive compositions employing polymers with pendant acid sensitive moieties have been described in the art (Ito, H.; Ueda, M. *Macromolecules* 1988, 21, 1475-82). o-Nitrobenzyl substituted polyacrylates have been described in U.S. Pat. No. 3,849,137 (Nov. 19, 1974; Barzynski). t-Butyl substituted polyacrylates have also been reported (Ito, H.; Willson, C. G. in *Proc. SPIE-Int. Soc. Opt. Eng.* 1987, 771, 24; and U.S. Pat. No. 4,491,628 (Jan. 1, 1985; Ito). U.S. Pat. No. 4,963,463 (Koshiba et al.) claims a radiation sensitive resin composition comprising an alkali soluble resin, an o-quinone diazide, an aci sensitive esters of nitrobenzyl or cyanobenzyl alcohol.

End-capped polyphthaladehyde has been employed in imaging systems in combination with onium salts which were used as a source of photogenerated acid (Ito, H.; Willson, C. G. *Polym. Eng. Sci.* 1983, 23, 1013). Photoresists based on thermal polycarbonate degradation in the presence of photogenerated acid have also been described (Frechet, J. M. J.; Bouchard, F.; Houlihan, F. M.; Kryczka, B.; Eichler, E.; Clecak, N.; Willson, C. G. *J. Imag. Sci.* 1986, 30, 59). Both of these systems function by cleavage of the polymer backbone.

Canadian Patent No. 672,947 (Canadian Industries Ltd.) describes protective films comprising copolymers of tetrahydropyran-2-yl acrylates, and glycidyl esters of acrylates. These films are thermally processed, thereby effecting cleavage of the tetrahydropyran-2-yl groups, and subsequently causing cross-linking of the carboxylic acid and the epoxy residues.

Benzyl, benzhydryl, and triphenylmethyl acrylates have been imaged using high energy radiation (e.g., electron beam, x-ray, and ion beam) sources followed by development with aqueous alkaline solutions as described in Japanese published applications 59-075244 (Apr. 27, 1984; Hitachi, Ltd.), and 58-068743 (Apr. 23, 1983; Hitachi, Ltd.).

Dimethylbenzyl methacrylates have been employed in combination with iodonium salts as deep-UV photoresists (Ito, H. *Polym. Mater. Sci. Eng.* 1989, 60, 142).

α-Substituted benzyl methacrylate polymers have been photoimaged and developed with an alkaline developer (Ito, H.; Ueda, M.; Ebina, M. *ACS Symp. Ser.* 1989, 412, 57-73).

Japanese published applications 63-256492 (Oct. 24, 1988; Fuji Photo Film Co., Ltd.) and 63-317388 (Dec. 26, 1988; Fuji Photo Film Co., Ltd.) describe several direct-image lithographic plate formulations employing polymers having side-chain groups which, following an etching development step, cleave to form hydroxyl and carboxyl groups.

Japanese published patent applications 53-094691 (Oct. 24, 1989, Fuji Photo Film) and 53-100192 (Oct. 30, 1989, Fuji Photo Film) describe lithographic plates containing polymers with acid labile groups including some alkoxyalkyl esters. The plates also contain cross-linking agents which appear to cross-link with carboxylic acid residues as they are formed. These plates appear to act in a negative-tone and may involve a development step.

Japanese published application 62-299,313 (Jun. 1, 1989, Matsushita Electric Industrial) describes the use of polymers containing acid anhydride residues in combination with o-nitrobenzyl esters of carboxylic acids. These polymers are sensitive only to UV radiation.

SUMMARY OF THE INVENTION

The novel photosensitive compositions of the present invention comprise: (a) a photoinitiator which generates an acid upon exposure to radiation; and (b) a polymer having acid labile groups pendant from the polymer backbone, said pendant groups being represented by the formula

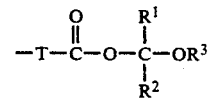

wherein:

$R^1$ and $R^2$ each represent H or an alkyl group with 1 to 18 carbon atoms with the proviso that at least one of $R^1$ and $R^2$ must be hydrogen; $R^3$ represents an alkyl group with 1 to 18 carbon atoms; or any two of $R^1$, $R^2$, and $R^3$ may together form a substituted or unsubstituted ring having from 3 to 36 carbon atoms; and T represents a divalent linking group bonded to the polymer backbone contains a total of from 0 (a covalent bond) or 1 to about 18 carbon atoms where up to one of each three carbon atoms may be replaced by oxygen, nitrogen, or sulfur atoms or combinations thereof.

In another embodiment of the present invention, an imageable article is provided which comprises a substrate coated with the above-described photosensitive composition.

In still other embodiments of the present invention, processes for forming an imaged article are provided.

One inventive process involves the formation of an imaged article comprising exposing an imageable article (as disclosed herein earlier) to radiation within a range absorbed by the photoinitiator present in the imageable article to form a latent image bearing article and thereafter, applying ink to the latent image bearing article, thereby forming an imaged article. An alternative to the above process involves contacting the latent image bearing article with a dye, instead of ink to form an imaged article.

Another inventive process for the formation of an imaged article comprises the steps of exposing an imageable article (as disclosed herein above) to a range absorbed by the photoinitiator present in the imageable article thereby forming a first latent image bearing article; contacting the first latent image bearing article with a hydrophilizing agent to form a second latent image bearing article; and thereafter, contacting the second latent image bearing article with a dye solution to form an imaged article. In an alternate embodiment to this process, the second latent image bearing article is contacted with ink, instead of a dye, to form an imaged article.

Also provided is a process for forming and fixing an imaged article comprising the steps of:
a) exposing an imageable article to radiation within a range absorbed by said photoinitiator to form a first latent bearing article;
b) heating said first latent image bearing article to a temperature greater than about 100° C. to form a second latent image bearing article, and
c) cooling said heated latent image bearing article to below 40° C. to form a third latent image bearing article, and
d) exposing said modified latent image bearing article to white light to form a fourth latent image bearing article, and
e) contacting said fourth latent image bearing article with hydrophilizing agent to form a fifth latent image bearing article, and
f) applying ink to said fifth latent image bearing article to form an imaged article.

The photosensitive compositions of the present invention do not have the previously discussed disadvantages and drawbacks associated with the use of conventional materials. Because the inventive compositions can be used in either self-developing processes or ones which require only neutral aqueous developing conditions, their use is more economical, efficient, and environmentally sound than the use of conventional materials.

Other aspects, embodiments, and advantages of the present invention will be apparent from the detailed description, the examples, and the appended claims.

DETAILED DESCRIPTION OF THE INVENTION

The photosensitive composition of the present invention comprises a photoinitiator which generates an acid upon exposure to radiation and a polymer having acid labile groups pendant from the polymer backbone, the pendant acid labile groups being represented by the general formula:

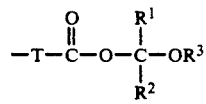

wherein
$R^1$ and $R^2$ each represent H or an alkyl group with 1 to 18 carbon atoms with the proviso that at least one of $R^1$ and $R^2$ must be hydrogen; $R^3$ represents an alkyl group with 1 to 18 carbons; or any two of $R^1$, $R^2$, and $R^3$ may together form a substituted or unsubstituted ring having from 3 to 36 carbon atoms. With regard to $R^1$, $R^2$, and $R^3$, preferred alkyl groups are methyl and ethyl. Preferred ring structures are furanyl, puranyl, and oxabicyclooctyl. T represents a divalent linking group bonded to the polymer backbone and contains from about 0 to about 18 carbon atoms where up to one of each three carbon atoms may be replaced with oxygen, nitrogen, or sulfur atoms or combinations thereof. Preferably, T should contain no functional groups which are more basic than the alkoxyalkyl ester moiety employed in the present invention. Representative examples of such functional groups (which are more basic than the alkoxyalkyl ester moiety) include, but are not limited to, amines, alkoxides, sulfides, amides, urethanes, imides, etc. Non-limiting examples of T include methylidene, 1,5-pentanediyl, 2-oxo-propanediyl, phenylene, and the like.

The polymers of the present invention are preferably derived from any non-basic (i.e., not containing 1°, 2°, or 3° amines or phosphines) polymer backbone, and may be prepared by any of the known in the art methods for preparing polymers (such as free radical, anionic, condensation, and cationic polymerization). Non-limiting examples of non-basic polymer backbones are polyacrylates, polymethacrylates, polystyrenes, acrylonitrile-styrene copolymers, butadiene-styrene copolymers, polyolefins (e.g. polyethylene, polypropylene, polyisobutylene, etc.), polyesters, polyethers, polycarbonates, polysulfides, and the like. Examples of basic polymer backbones are those containing 1°, 2°, or 3° amines or phosphines; of 1° or 2° amides. Preferred polymer backbones are derived from free radical polymerized polymers. Particularly preferred polymer backbones are polyacrylates and polymethacrylates. Additionally, it may be desirable in some applications that the polymer matrix be cross-linked, while in other instances it may be preferable that there be no cross-linking.

Alkoxyalkyl ester moieties may be either incorporated within monomer units prior to polymerization or attached to already formed polymer backbones using methods well known in the chemical art. For example, in cases in which an active hydrogen atom is present on the polymer backbone (for example, —OH, —C(O)CH$_2$C(O)—, —SH, and the like), deprotonation with a strong base (such as sodium hydride, lithium diisopropylamide, potassium t-butoxide, or any other base having sufficient strength to abstract the active hydrogen atom), followed by condensation with alkoxyalkyl ester moieties having reactive groups such as epoxy, haloacyl, carboxyalkyl, and the like may be used to prepared the polymers of the present invention. In cases in which olefinic unsaturation is present, alkoxyalkyl ester moieties having alkenyl substituents may be added by reactions such as Diels-Alder 4+2 thermal cycloadditions or 2+2 photocycloaddition. In still other cases in which no recognized functionality is present (e.g., polyethylene, polypropylene, etc.), one may corona treat or otherwise oxidize said polymer to provide active hydrogen sites on the polymer backbone.

The photoinitiator used herein is one which generates acid upon exposure to radiation. Many such substances are known in the photoimaging art including, but not limited to, various onium compounds (e.g., sulfonium, iodonium, diazonium, etc.; particularly aryl derivatives thereof), and various organic compounds with photolabile halogen atoms (α-halo-p-nitrotoluenes, α-halomethyl-s-triazines, carbon tetrabromide, etc.) While the choice of photoinitiator is not critical, it is desirable that the photoinitiator have limited solubility in water in order to provide maximal inkability.

In a preferred embodiment, the photoinitiator is a substituted or unsubstituted diaryliodonium salt generally described by the formulae:

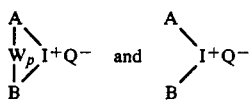

wherein A and B are substituted or unsubstituted aryl groups with a total of from 4 to 20 carbon atoms (e.g., substituted or unsubstituted phenyl, naphthyl, thienyl, and furanyl). W is selected from the group consisting of a carbon-carbon bond; oxygen; sulfur,

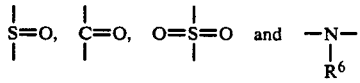

wherein $R^6$ is aryl (e.g., 6 to 20 carbon atoms) or acyl (e.g., 2 to 20 carbon atoms), or $R^7$-C-$R^8$ wherein $R^7$ and $R^8$ are individually selected from hydrogen, alkyl groups of 1 to 4 carbon atoms, and alkenyl groups of 2 to 4 carbon atoms, p is 0 or 1; and $Q^-$ is any anion capable of forming a stable salt with diphenyliodonium cation at room temperature, i.e., the anion must have a $pK_a$ less than about 16, and an oxidation potential of greater than about 0.7 V. Preferred anions $Q^-$ are complex halogenated metal anions such as hexafluorophosphate, hexafluoroantimonate, hexafluoroarsenate; borates such as tetrafluoroborate and tetraphenylborate. Particularly preferred anions are hexafluorophosphate, hexafluoroantimonate, hexfluoroarsenate, and tetrafluoroborate.

Non-limiting examples of suitable iodonium salts are salts of diphenyliodonium, dinaphthyliodonium, di(4-chlorophenyl)iodonium, tolyl(dodecylphenyl)iodonium, naphthylphenyliodonium salts, 4-(trifluoromethylphenyl)phenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, and the like. Diphenyliodonium salts are preferred The photolyzable organic halogen compounds which are useful in the present invention are those that upon exposure to radiation dissociate at one or more carbon-halogen bonds to form free radicals. The carbon-halogen bond dissociation energy should be between about 40 and 70 kcal/mole as taught in U.S. Pat. Nos. 3,515,552 (Jun. 2, 1970; Smith). Preferred photolyzable organic halogen compounds have from 1 to 40 carbon atoms, are non-gaseous at room temperature, and have a polarographic half-wave reduction potential greater than about −0.9 V as described in U.S. Pat. Nos. 3,640,718 (Feb. 8, 1972; Smith) and 3,617,288 (Nov. 2, 1971; Hartman).

Examples of photolyzable organic halogen compounds are hexabromoethane, α,α,α′,α′-tetrabromoxylene, carbon tetrabromide, m-nitro(tribromoacetyl)benzene, α,α,α-trichloroacetanilide, trichloromethylsulfonylbenzene, tribromoquinaldine, bis(pentachlorocyclopentadiene), tribromomethylquinoxaline, α,α-dibromo-p-nitrotoluene, α,α,α,α′,α′,α′-hexachloro-p-xylene, dibromotetrachloroethane, pentabromoethane, dibromodibenzoylmethane, carbon tetraiodide, halomethyl-s-triazines such as 2,4-bis(trichloromethyl)-6-methyl-s-triazine, 2,4,6-tris(trichloromethyl)-s-triazine, and 2,4-bis(trichloromethyl)-6-(p-methoxystyryl)-s-triazine, etc.

The iodonium salts or photolyzable organic halogen compounds employed in the present invention may be either exposed to ultraviolet radiation or sensitized into the visible spectrum. Wavelengths between 250 nm and 900 nm inclusive may be used. Compounds useful as sensitizing dyes of this invention include, but are not limited to aryl nitrones, xanthenes, anthraquinones, substituted diaryl- and triarylmethanes, methines, merocyanines, and polymethines, thiazoles, substituted and unsubstituted polycyclic aromatic hydrocarbons, and pyrylium dyes.

In some instances it is desirable to add at least one additional polymer to the photosensitive compositions of the present invention. The polymers generate additional hydrophilic functionality upon exposure to light and treatment with aqueous solutions; therefore, serve to increase the differential in wettability between the exposed and unexposed regions of the photosensitive composition. The additional polymer may be present in amounts up to 90 percent by weight, preferably not more than 50 percent. Preferably, the additional polymer is a homo- or co-polymer of an acid anhydride. Most preferably, the additional polymer is a homo- or co-polymer of maleic anhydride (e.g., GANTREZ TM AN139 available from GAF Corp., Wayne, N.J.).

Additionally, it may be desirable to treat the photosensitive compositions of the present invention with at least one hydrophilizing agent subsequent to exposure. Suitable hydrophilizing agents increase the wettability in exposed regions without affecting the wettability in unexposed regions of the photosensitive composition, thereby increasing the differential in wettability between exposed and unexposed regions. Preferably, the at least one hydrophilizing agent is a basic material compound. Most preferably, the basic material is an 1°, 2°, 3°, or 4° amine-substituted sulfonic acid or its salt having from 2 to 18 carbon atoms (e.g., 4-morpholinepropanesulfonic acid, β-hydroxy-4-morpholinepropanesulfonic acid salt, 4-morpholineethanesulfonic acid, sodium 4-morpholinepropanesulfonate, sodium cysteate, pyridinium, etc.), an 1°, 2°, 3°, or 4° amine-substituted alcohol (e.g., tetrakis(2-hydroxyethyl)ethylenediamine, 2-amino-1,3-propanediol, triethanolamine, or its acid salts, etc.) or amine-substituted carboxylic acid (e.g., glycine, alanine, 3-dimethylaminopropanoic acid, etc.) The method of treatment is not critical and may be accomplished for example by wiping or spraying the hydrophilizing agent onto the exposed plate, or by dipping the exposed plate into a solution of the hydrophilizing agent, or by means of a fountain solution when used on a press. Additionally, an acid-base indicator dye can be added to the formulation. This can serve to give the plate a color initially as well as to give a printout image upon image-wise exposure. A further advantage of having visible dye present is that it tends to increase the handling time under fluorescent lights before the plate becomes over exposed.

The photosensitive compositions of the present invention are generally coated onto a substrate prior to use in an imaging application. Coating may be achieved by many methods well known in the imaging art (e.g., solvent casting, knife coating, extrusion, etc.). Suitable substrates on which the compositions of the present invention may be supported include, but are not limited to, metals (e.g., steel and aluminum plates, sheets, and foils); films or plates composed of various film-forming synthetic or high polymers including addition polymers (e.g., polyvinylidene chloride, polyvinyl chloride, polyvinyl acetate, polystyrene, polyisobutylene polymers and copolymers), and linear condensation polymers (e.g., polyethylene terephthalate, polyhexamethylene adipate, polyhexamethylene adipamide/adipate); non-woven wood by-product based substrates such as paper and cardboard; and glass. Substrates may be transparent or opaque.

The photosensitive compositions of the present invention may contain various materials in combination with the essential ingredients of the present invention. For example, plasticizers, coating aids, antioxidants, surfactants, antistatic agents, waxes, ultraviolet radiation absorbers, and brighteners may be used without adversely affecting the practice of the invention. The various materials should preferably not contain functional groups which are more basic than the alkoxyalkyl ester employed in the present invention (e.g., free amines, alkoxides, sulfides, amides, urethanes, imides, etc.) as defined above, in a molar amount higher than the molar amount of photoacid precursor.

In still other embodiments of the present invention, processes for forming an imaged article are provided.

One inventive process involves the formation of an imaged article comprising exposing an imageable article (as disclosed herein earlier) to radiation within a range absorbed by the photoinitiator present in the imageable article to form a latent image bearing article and thereafter, applying ink to the latent image bearing article, thereby forming an imaged article. An alternative to the above process involves contacting the latent image bearing article with a dye, instead of ink to form an imaged article.

Another inventive process for the formation of an imaged article comprises the steps of exposing an imageable article (as disclosed herein above) to a range absorbed by the photoinitiator present in the imageable article thereby forming a first latent image bearing article; contacting the first latent image bearing article with a hydrophilizing agent to form a second latent image bearing article; and thereafter, contacting the second latent image bearing article with a dye solution to form an imaged article. In an alternate embodiment to this process, the second latent image bearing article is contacted with ink, instead of a dye, to form an imaged article.

Additionally, an ammonium salt can be added to the formulation. This provides for a process for fixing an imaged article comprising the steps:

a) exposing an imageable article to radiation within a range absorbed by said photoinitiator to form a first latent image-bearing article;
b) heating said first latent image bearing article to a temperature greater than about 100° C. to form a second latent image bearing article;
c) cooling said heated latent image bearing article to below 40° C. to form a third latent image bearing article;
d) exposing said modified latent image bearing article to white light to form a fourth latent image bearing article;
e) contacting said fourth latent image bearing article with hydrophilizing agent to form a fifth latent image bearing article; and
f) applying ink to said fifth latent image bearing article to form an imaged article.

Alternatively, the addition of an ammonium salt gives a wash off system by the following process:

a) exposing an imageable article to radiation within a range absorbed by said photoinitiator to form a first latent image-bearing article; and
b) contacting said first latent image-bearing article with a hydrophilizing agent to form an imaged article.

The following non-limiting examples further illustrate the present invention.

EXAMPLES

The materials employed below were obtained from Aldrich Chemical Co. (Milwaukee, Wis. unless otherwise specified. Materials were analyzed by one or more of the following techniques $^1$H NMR, infrared, and mass spectroscopy; gel phase chromatography; and differential scanning calorimetry. The term MEK means methyl ethyl ketone. Aluminum plates used for coatings in the following experiments were cleaned, degreased lithograde alloy, brush grained, electrochemically grained, anodized aluminum sheets. Exposures were conducted using a Berkey Ascor vacuum frame exposure unit (Berkey Technical Co., Woodside, N.Y.) equipped with a 2 kW Ascor Addalux Lamp No. 1406-01. A neutral density 21 step (0.15 absorbance units/step) sensitivity guide (Stouffer Graphic Arts Equipment Co., South Bend, Ind. was used to measure the photosensitivity of the coatings prepared below.

The term solid step as used below refers to the highest numbered step which is completely dyed by the dye solution. The term open step refers to the highest numbered step which is completely free of ink after inking of the imaged plate. Rubb-Up TM Ink U-62 (Printing Development, Inc., Racine, Wis.) was used to ink plates described below. Primed polyester film used in the following examples is described in U.S. Pat. No. 4,335,220 Jun. 15, 1982; Coney).

EXAMPLE 1

This example describes the preparation of poly(methoxymethyl acrylate) in two steps.

To a solution of 5.0 g (69 mmol) acrylic acid and 6.14 g (76.1 mmol) chloromethyl methyl ether in 25 ml methylene chloride was added a solution of 7.72 g (76.3 mmol) triethylamine in 25 ml methylene chloride at 5° C. The reaction mixture was allowed to warm to room temperature and was stirred overnight, poured into aqueous sodium bicarbonate, and extracted with ether.

The ether layer was dried over anhydrous magnesium sulfate and concentrated in vacuo. The residue was distilled at 67°-70° C. and 90-100 torr pressure to give 4.61 g of methoxymethyl acrylate (39.7 mmol, 57% yield).

A solution of 1.0 g methoxymethyl acrylate and 0.01 g azobis(isobutyronitrile) (also known in the art as AIBN) in 1 ml toluene was heated to 60° C. for 24 hr. The mixture was cooled and stirred with methanol for 24 hr. The resultant glassy material was placed in a vacuum oven at 50° C. and 0.1 torr for 24 hr to give poly(methoxymethyl acrylate).

EXAMPLE 2

This example demonstrates that photosensitive compositions of the present invention may be imaged directly without traditional development methods, or alternatively, with aqueous development.

A photosensitive composition was prepared by mixing: 0.472 g poly(methoxymethyl acrylate), 0.028 g diphenyliodonium hexafluorophosphate 0.14 g 9,10-diethoxyanthracene and 5.0 ml MEK.

The photosensitive composition prepared above was filtered and coated onto two aluminum plates with a #7 wire-wound rod (R&D Specialties, Webster, N.Y.; wet thickness, 0.023 mm) and heated to 85° C. for 5 min. The samples were exposed for 1 min as described above.

One plate was developed by washing with hot tap water to give a positive-tone photoresist pattern. The exposed regions of the plate were wet by the water while unexposed regions remained dry. During the water rinse step the coating in the exposed areas was removed.

The other plate was not developed, but a negative-tone image was obtained by dipping the plate into an aqueous solution of Methylene Blue. The exposed areas turned blue while the unexposed areas did not change color.

A solution of 17.5 g methoxymethyl acrylate and 0.26 g of AIBN in 18 ml MEK was heated to 60° C. for 24 hr, and then an additional 18 ml MEK was added. A solution using 0.5 ml of the polymer solution, 1.5 ml of a 10% solution of GANTREZ TM AN-139 (GAF Corp., Wayne, N.J.) in MEK, diphenyliodonium hexafluorophosphate, 9,10-diethoxyanthracene and 4.4 ml MEK was coated onto aluminum plates with a number 12 wire-wound rod and heated to 85° C. for 5 min. The samples were exposed for 10 sec as described above. The sample was swabbed with a 10% aqueous solution of tetra(hydroxyethyl)ethylenediamine, and then hand inked to give an open 2 step.

A sample was prepared with above solution coated on polyester, and exposed in the same manner for 5 seconds, then soaked in a 10% solution of aqueous Methylene Blue to give an open 4 step.

EXAMPLE 3

This example describes the preparation of poly(tetrahydropyran-2-yl acrylate) in two steps.

A solution of 10.5 g (146 mmol, 10 ml) acrylic acid and 14.0 g (166 mmol, 15.2 ml) dihydropyran in 40 ml dichloromethane was stirred at room temperature for one day. The mixture was washed with saturated aqueous sodium bicarbonate and the organic layer was concentrated in vacuo. The residue was distilled to give 5.93 g (38.0 mmol, 26% yield) tetrahydropyran-2-yl acrylate, bp 40° C. at 0.2 torr.

A solution of 2.8 g (18 mmol) tetrahydropyran-2-yl acrylate prepared above and 0.028 g AIBN in 2.8 ml toluene was stirred at 60° C. for 24 hr to give a solution of poly(tetrahydropyran-2-yl acrylate). This solution was concentrated in vacuo to give the polymer.

Solution A was prepared by dissolving the polymer isolated above in 3.0 ml MEK.

EXAMPLE 4

This example demonstrates that photosensitive compositions of the present invention may be imaged directly without development, or alternatively, with aqueous development.

A photosensitive composition was prepared by mixing: 1 ml Solution A (from Example 3), 0.0195 g diphenyliodonium hexafluorophosphate, 0.0195 g 9,10-diethoxyanthracene, and 2.2 ml MEK.

The mixture prepared as described above was filtered and the filtrate were coated onto three aluminum plates with a #7 wire-wound rod (wet thickness 0.92 mil, metric conversion=0.023 mm) and heated to 85° C. for 5 min. One sample was exposed for 5 sec as described above followed by rinsing with hot tap water. The exposed regions of the plates were obviously more hydrophilic than the unexposed regions as observed by the behavior of water spread on the surface. During the water rinse step the coating in the exposed areas was removed.

A negative-tone image was obtained by dipping a second sample into a 10 wt % aqueous solution of Methylene Blue. The exposed areas became colored by the dye while the unexposed areas remained unchanged.

A third sample gave a positive-tone image when immersed in water and rubbed with ink. The exposed areas remained clear while the unexposed areas became inked.

The water contact angles of the exposed and unexposed regions of these samples were measured using a goniometer: in the exposed region the advancing contact angle was 24° while in the unexposed region the advancing contact angle was 60°.

A fourth sample was prepared as above except that the coating substrate was polyester film. After exposure, the imaged article was dipped into a solution of Methylene Blue as described above to give a negative-tone image.

EXAMPLE 5

Preparation of Poly(tetrahydropyran-2-yl acrylate) Solution: To a solution of 35.6 g tetrahydropyran-2-yl acrylate in 35.6 ml toluene was added 0.356 g AIBN. The mixture was stirred for 2 hr, heated to 60° C. for 14 hr, and then cooled. To the reaction mixture was added 37.8 ml MEK and the mixture was rotated until it became homogeneous. This is referred to as Solution B.

The following coating solution was prepared: 20 ml Solution B, 9.7 g poly(tetrahydropyran-2-yl acrylate), 24 ml toluene, 25.6 ml MEK, 0.39 g diphenyliodonium hexafluorophosphate, 0.39 g 9,10-diethoxyanthracene, 44 ml MEK.

EXAMPLE 6

Synthesis of tetrahydropyran-2-yl methacrylate (method A): a solution of 25.0 g (290 mmol) methacrylic acid and 27.8 g (330 mmol) dihydropyran in 80 ml of dichloromethane was stirred for 14 hr at room temperature. The reaction mixture was thoroughly extracted with saturated aqueous sodium bicarbonate, dried (MgSO$_4$) and concentrated in vacuo. The residue was distilled to give 1.84 g (10.8 mmol; 3.7% yield) tetrahydropyran-2-yl methacrylate, bp 53° C. at 0.2 torr.

Synthesis of tetrahydropyran-2-yl methacrylate (method B): to a solution of 25.8 g (0.3 mol) methacrylic acid and 1.8 g (0.011 mol) 2,4-dinitrotoluene in 25.2 g (0.3 mol) dihydropyran was added 0.05 ml (0.0015 mol) concentrated hydrochloric acid. The reaction mixture was allowed to stir at 50° C. for 25 hr. The hydrochloric acid was neutralized with solid sodium bicarbonate and the mixture was filtered. The filtrate was distilled to give 46.5 g (0.273 mol, 91% yield) tetrahydropyran-2-yl methacrylate, bp 50° C. at 0.15 torr.

Preparation of poly(tetrahydropyran-2-yl methacrylate) solution: to a solution of 35.6 g tetrahydropyran-2-yl methacrylate in 35.6 ml toluene was added 0.356 g AIBN. The mixture was stirred for 2 hr, then heated to 60° C. for 14 hr, and finally cooled. To the reaction mixture was added 37.8 ml MEK, and the mixture was rotated until it became homogeneous. This solution is referred to as solution C.

A coating solution was prepared by combining: 20 ml solution C, 0.39 g diphenyliodonium hexafluorophosphate, 0.39 g 9,10-diethoxyanthracene, 44 ml MEK. This coating solution was filtered and the filtrate was coated onto aluminum plates using a #7 wire-wound rod (wet thickness 0.92 mil, metric conversion=0.023 mm) and heated to 85° C. for 5 min. Samples of the coated plate were exposed 3 sec as described above. The exposed regions of the plates were more hydrophilic than the unexposed regions as observed by the behavior of water spread on the surface. These samples gave positive-tone images when inked.

Prior to exposure, several other samples of the coated aluminum plate were placed in an oven at 50° C. for more than two weeks; when imaged these samples showed no degradation in properties.

EXAMPLE 7

In a separate procedure, 1.0 wt % Bromphenol Blue and 0.57 wt % trioctylamine were added to the coating solution of Example 6 resulting in a color change from blue to yellow in the light struck areas.

EXAMPLE 8

Tetrahydropyran methacrylate (33.0 g) was combined with 0.33 g AIBN in 33 ml MEK and heated to 60° C. for 24 hr, then cooled. This mixture was combined with 33 ml MEK to give solution D.

Sample were coated and irradiated according to the conditions of Example 7, but using the following formulation: 20 ml solution D, 0.39 g diphenyliodonium hexafluorophosphate, 0.39 g 9,10-diethoxyanthracene, 44 ml MEK.

After exposure samples were immersed in or in some cases swabbed with a 10% aqueous solution of a hydrophilizing agent. Following treatment the exposed regions of the plates became more hydrophilic than exposed regions of untreated plates as determined by the ease of hand inking the samples. These samples gave positive-tone images when inked. Alternatively, development with a 10% aqueous solution of sodium bicarbonate immediately following exposure increases the hydrophilicity of the exposed regions.

Compounds which were found effective as hydrophilizing agents are: 4-morpholinepropanesulfonic acid, 4-morpholineethanesulfonic acid (MES), β-hydroxy-4-morpholinepropanesulfonic acid sodium salt, sodium 4-morpholinepropanesulfonate, sodium cysteate, tetrakis(2-hydroxyethyl)ethylenediamine, triethanolamine, and triethanalamine hydrochloride, Solutions of the preceding hydrophilizing agents prepared using 10% sodium bicarbonate as the diluent were particularly effective.

EXAMPLE 9

A coating solution, prepared as described in Example 8, was filtered and the filtrate was coated onto primed polyester film with a #7 wire-wound rod (wet thickness 0.92 mil, metric conversion=0.023 mm) and heated to 85° C. for 5 min. The sample was exposed 40 sec as described above. The samples were then soaked in a 10% aqueous solution of a hydrophilizing agent and then in an aqueous solution of Methylene Blue (20 wt %). This treatment made the exposed regions of the samples much denser blue as compared to an untreated sample. An open 3 step was observed.

EXAMPLE 10

This example demonstrates the use of an added polymer.

A coating formulation was prepared by combining: 1.5 ml Gantrez ™ AN-139 (10 wt % in MEK), 0.5 ml poly(tetrahydropyran-2-yl-methacrylate) solution (33 wt % in MEK), 0.078 g diphenyliodonium hexafluorophosphate, 0.019 g 9,10-diethoxyanthracene, 4.4 ml MEK.

A dye solution was prepared by combining: 3 parts Methylene Blue solution (10 wt % in water) and 1 part sodium bicarbonate solution (10 wt % in water).

Solutions were coated with a #12 wire-wound rod (wet thickness 1.16 mil, metric conversion=0.029 mm) on primed polyester and dried in an oven at 85° C. for 5 minutes. Exposures were generally less than 10 seconds. The system has a sensitivity of better than 10 mJ/cm$^2$. The exposed samples were dyed in the bath by submersing the sample for 5 minutes at room temperature to give negative-tone images. Longer soak times did not improve the density of the films. The samples were rinsed with water and dried. Soaking the samples in pure water at this stage did not leach the dye from the film.

EXAMPLE 11

A coating formulation was prepared as described below: 9.0 ml Gantrez ™ AN-139 solution (10 wt % in MEK), 3.0 ml poly(tetrahydropyran-2-yl-methacrylate) (33 wt % in MEK), 0.468 g diphenyliodonium hexafluorophosphate, 0.117 g 9,10-diethoxyanthracene, 0.03 g of Bromophenol Blue, 30 ml trioctylamine solution (0.2% in MEK).

A solution of hydrophilizing agent was prepared as follows: 10 g sodium bicarbonate, 10 g 4-morpholinoethanesulfonic acid, and 100 ml water.

The solution was coated onto aluminum and heated to 85° C. for 5 min and exposed for 40 sec, and then swabbed with the hydrophilizing solution. This sample was press tested and rated at 250,000 impressions under accelerated abrasion testing.

EXAMPLE 12

This example shows that thickness of coating affects the density of the generated image, and illustrates the use and effectiveness of various dyes.

In this example all solutions were coated with a #12 (coating formulation 1, 0.027 mm wet thickness) or #20

(coating formulation 2, 0.046 mm wet thickness) wire-wound rod on primed polyester and dried in an oven at 85° C. for 5 minutes. Exposures were generally less than 10 seconds. The system has a sensitivity of better than 10 mJ/cm$^2$. The exposed samples were dyed in the bath by submersing the sample for 5 minutes at room temperature. Longer soak times did not improve the density of the films. The samples were rinsed with water and dried. Soaking the samples in pure water at this stage did not leach the dye from the film. The coating formulations and the dye bath formulations are given below.

Coating formulation 1 (film system): 1.5 ml Gantrez TM AN-139 solution (10 wt % in MEK), 0.5 ml poly(tetrahydropyran-2-yl-methacrylate) solution (33 wt % in MEK), 0.078 g diphenyliodonium hexafluorophosphate, 0.019 g 9,10-diethoxyanthracene, 4.4 ml MEK.

Coating formulation 2 (film system): 1.5 ml Gantrez TM AN-139 solution (10 wt % in MEK), 0.5 ml poly(tetrahydropyran-2-yl-methacrylate) solution (33 wt % in MEK), 0.078 g diphenyliodonium hexafluorophosphate, 0.019 g 9,10-diethoxyanthracene, 3.5 ml MEK.

The following dye solutions in Dye bath formulations 1 and 2 were prepared at 10 wt % in water.

Dye bath formulation 1: 26.25 parts Methylene Blue solution, 7.5 parts Azure A solution, 3.75 parts Thioflavin T, and 37.5 parts Malachite Green oxalate, and 25 parts sodium bicarbonate.

Dye bath formulation 2: 15 parts Methylene Blue solution, 50 parts Azure A solution, 10 parts Thioflavin T, and 25 parts sodium bicarbonate solution.

TABLE 1

| Dye | MacBeth Densitometer Settings[a] | | | | Coating Formulation[b] |
|---|---|---|---|---|---|
| | Green | Blue | Red | White | |
| Methylene Blue | 2.89 | 1.17 | 2.13 | 1.54 | 1 |
| | 3.00 | 2.19 | 2.50 | 2.50 | 2 |
| Azure A | 3.04 | 2.07 | 2.50 | | 1 |
| | 3.15 | 2.25 | 2.23 | 2.53 | 2 |
| Thioflavin T | 0.00 | 0.73 | 0.20 | | 1 |
| | 0.00 | 1.05 | 0.04 | 0.26 | 2 |
| Malachite Green Oxalate | 0.45 | 0.44 | 0.41 | | 1 |
| | 0.36 | 0.35 | 0.97 | 0.34 | 2 |
| Dye Bath Formulation 1 | 2.22 | 2.03 | 2.14 | 1.99 | 1 |
| Dye Bath Formulation 2 | 3.07 | 2.58 | 2.22 | 3.20 | 2 |
| Dye Bath Formulation 3 | 2.22 | 2.58 | 3.07 | 3.20 | 2 |
| Marker | | | | 2.68 | 1 |

[a]Density values.
[b]Formulation 2 is more concentrated than Formulation 1.

EXAMPLE 13

A coating solution was prepared by combining: 1.5 mL Gantrez TM solution (10% by weight in MEK), 0.5 ml poly(tetrahydropyran-2-yl-methacrylate) solution (33% by weight in MEK), 0.078 g diphenyliodonium hexafluorophosphate, 0.019 g 9,10-diethoxyanthracene, 4.4 ml MEK.

The solution was coated with a #12 wire-wound rod (wet thickness 1.08 mil, metric conversion=0.027 mm) onto pieces of primed polyester as described in Example 12. All samples were dried in an oven at 85° C. for 5 minutes, and exposures were generally less than 10 seconds. This system had sensitivity better than 10 mJ/cm$^2$. Exposed samples were submersed in dye bath formulation 2 for 5 minutes at room temperature. Negative-tone images resulted under these conditions.

When the following formulation was used for a dye bath: 3 parts Methylene Blue (10 wt % in water), 1 part sodium hydroxide solution (4-10 wt % in water), positive-tone images were observed.

EXAMPLE 14

A printing plate was prepared by coating aluminum sheets with the formulation from Example 10. The coated sample was cut into strips and evaluated for sensitivity to fluorescent room light exposure. The sample was exposed through a step wedge using a Berkey-Ascor vacuum frame, exposed to room lighting for varying amounts of time, and then inked. Strips were exposed for 10 seconds to give 8 steps with no room light exposure, 9 steps with 5 min room light exposure and 10 steps with 10 min room light exposure.

The above experiment was rerun replacing 9,10-diethoxyanthracene with 2-ethylanthracene in the coating formulation. Strips were exposed through a mask with a Berkey Ascor for 20 seconds and then exposed to room light followed by inking. With no room light exposure the number of steps was 9. With 30 min room light exposure the number of steps was still only 9.

EXAMPLE 15

This example describes the synthesis of poly(tetrahydrofuran-2-yl methacrylate).

To a solution of 10 g methacrylic acid in 10 ml dichloromethane was added a solution of 9.28 ml 2,3-dihydrofuran in 30 ml dichloromethane. The reaction was allowed to stir for 14 hr at room temperature. The mixture was washed with a saturated solution of sodium bicarbonate. The organic layer was dried with MgO/MgSO$_4$ and concentrated in vacuo. The residue was distilled at 38° C./0.3 torr, to give 6.2 g (34% yield) of tetrahydrofuran-2-yl methacrylate. A solution of 6.0 g tetrahydrofuran-2-yl methacrylate and 0.066 g AIBN in 6 ml of MEK was heated to 60° C. for two days and 12 ml of MEK was added. This solution was used for further evaluation.

This solution was evaluated according to Example 10 substituting the above solution in place of tetrahydropyran-2-yl methacrylate. The solution was coated on aluminum and air dried for 30 min, exposed for 5 sec, swabbed with the hydrophilizing solution in Example 11, and hand inked to give an open 6 steps.

EXAMPLE 16

This example describes the synthesis of poly(ethoxyethyl methacrylate).

To a solution of 20 g methacrylic acid in 50 ml dichloromethane was added 19 g ethyl vinyl ether in 30 ml dichloromethane. The mixture was stirred overnight at room temperature and poured into ether and washed with a saturated aqueous solution of sodium bicarbonate until the solution ceased effervescing. The organic layer was dried with MgO/MgSO$_4$ and concentrated in vacuo. The residue was distilled at 25° C./0.1 torr to give 7.1 g (19% yield) of ethoxyethyl methacrylate. A mixture of 7.0 g ethoxyethyl methacrylate and 0.076 g AIBN in 7 ml MEK was heated to 60° C. for 24 hr and 7 ml MEK was added. This solution (solution E) was used for further evaluation.

EXAMPLE 17

A coating formulation was prepared by combining: 2.0 ml solution E, 0.078 g diphenyliodonium hexafluorophosphate, 0.0195 g 9,10-diethoxyanthracene, and 3.5 ml MEK. This formulation was coated using a #12 wire wound rod (0.027 mm wet thickness) onto an aluminum plate and heated to 80° C. for 5 min, exposed for 20 sec and hand inked to give an open 4 step.

EXAMPLE 18

A coating formulation was prepared by combining: 0.5 ml solution E, 0.078 g diphenyliodonium hexafluorophosphate, 0.039 g 9,10-diethoxyanthracene, 1.5 ml Gantrez TM AN-139 (as a 10 wt % solution in MEK), and 4.4 ml MEK. This formulation was coated using a #12 wire wound rod (0.027 mm wet thickness) onto an aluminum plate and heated to 80° C. for 5 min, exposed for 5 sec, swabbed with 10% aqueous triethanolamine and hand inked to give an open 5 step.

EXAMPLE 19

This example describes the synthesis of poly(methacrylonitrile-co-tetrahydropyran-2-yl methacrylate) (1:0.1).

A mixture of 5 g of tetrahydropyran-2-yl methacrylate and 0.19 g methacrylonitrile and 0.048 g AIBN in 5 ml MEK was heated to 60° C. for 24 hr and then cooled to room temperature. An additional 5 ml MEK was added and this mixture was used for further evaluation (solution F).

EXAMPLE 20

A coating formulation was prepared by combining: 2.0 ml solution F, 0.078 g diphenyliodonium hexafluorophosphate, 0.0195 g 9,10-diethoxyanthracene, and 4.4 ml MEK. The formulation was coated onto polyester film using a #12 wire wound rod, dried at 85° C. for 5 min, exposed for 10 sec, and dyed with dye bath solution 2 (Example 12) to give a closed 6 step.

EXAMPLE 21

A coating formulation was prepared by combining: 0.5 ml solution F, 0.078 g diphenyliodonium hexafluorophosphate, 0.039 g 9,10-diethoxyanthracene, 1.5 ml Gantrez TM AN-139 (as a 10 wt % solution in MEK), and 4.4 ml MEK. The formulation was coated onto aluminum using a #12 wire wound rod, dried at 85° C. for 5 min, exposed for 5 sec, swabbed with a solution of 10 g 4-morpholineethanesulfonic acid diluted to 100 ml with a 10 wt % NaHCO₃ solution, and hand inked to give an open 3 steps.

EXAMPLE 22

This example describes the synthesis of poly(itaconic anhydride-co-tetrahydropyran-2-yl methacrylate).

A solution of 3.0 g tetrahydropyran-2-yl methacrylate, 0.65 g itaconic anhydride, and 0.038 g AIBN in 3 ml of MEK was heated to 60° C. for 24 hr. An additional 2 ml MEK was added and this solution was used for further evaluation. A coating formulation was prepared from: 0.5 ml above solution, 1.5 ml Gantrez TM AN-139 (as a 10 wt % solution in MEK), 0.078 g diphenyliodonium hexafluorophosphate, 0.039 g 9,10-diethoxyanthracene, and 4.4 ml MEK.

This formulation was coated onto an aluminum plate using a #12 wire wound rod (0.027 mm wet thickness), dried at 85° C. for 5 min, exposed for 5 sec, swabbed with 10% aqueous triethanolamine solution, and hand inked to give an open 7 step.

EXAMPLE 23

A coating formulation was prepared by combining: 0.5 ml poly-tetrahydropyran-2-yl methacrylate (30 wt % in MEK), 1.5 ml styrene/maleic anhydride copolymer (10 wt % in MEK), 0.078 g diphenyliodonium hexafluorophosphate, 0.0195 g 9,10-diethoxyanthracene, and 3.5 ml MEK.

This formulation was coated onto an aluminum plate, dried at 85° C. for 5 min, exposed for 10 sec, swabbed with a solution of 10 g 4-morpholineethanesulfonic acid diluted to 100 ml with a 10 wt % NaHCO₃ solution, and hand inked to give an open 4 step.

This formulation was coated onto primed polyester film using a #12 wire wound rod (0.027 mm wet thickness), dried at 85° C. for 5 min, exposed for 10 sec dyed with dye bath solution 2 (Example 12) to give a closed 4 step.

EXAMPLE 24

This example describes the synthesis of poly(methyl methacrylate-co-tetrahydropyran-2-yl methacrylate) 1:1.

A mixture of 3.0 g tetrahydropyran-2-yl methacrylate, 1.8 g methyl methacrylate, and 0.058 g AIBN in 5 ml MEK was heated to 60° C. for 24 hr. After cooling an additional 5 ml MEK was added and this solution was used below.

A coating formulation was prepared by combining 0.5 ml of the above solution of poly(methyl methacrylate-co-tetrahydropyran-2-yl methacrylate), 1.5 ml Gantrez TM AN-139 (10 wt % solution in MEK), 0.078 g diphenyliodonium hexafluorophosphate, 0.0195 g 9,10-diethoxyanthracene, and 4.4 ml MEK. This formulation was coated onto an aluminum plate, dried at 85° C. for 5 min, exposed for 10 sec, swabbed with the hydrophilizing solution of Example 11, and hand inked to give an open 3 step.

The above coating solution was also coated with a #20 wire wound rod (10.046 mm wet thickness) onto primed polyester and dried at 85° C. for 5 min. A 10 sec exposure was followed by soaking in dye bath formulation 2 for 5 min. The coating produced in this manner had a density of 2.65 in the exposed areas and a background of 0.09 in unexposed regions.

EXAMPLE 25

This example describes the synthesis of poly(methyl methacrylate-co-tetrahydropyran-2-yl methacrylate 3:1.

A mixture of 1.0 g of tetrahydropyran-2-yl methacrylate, 1.8 g of methyl methacrylate, and 0.039 g of AIBN in 3 ml of MEK was heated to 60° C. for 24 hr. An additional 60 ml MEK was added and the resulting solution was added dropwise to a vigorously stirred container holding 180 ml methanol. The precipitated polymer was collected as a white solid which weighed about 2 g after drying. A 30 wt % solution of this material in MEK was prepared and used for further evaluation.

A coating formulation was prepared by combining 0.5 ml of the above solution of poly(methyl methacrylate-co-tetrahydropyran-2-yl methacrylate), 1.5 ml Gantrez TM AN-139 (10 wt % solution in MEK), 0.078 g diphenyliodonium hexafluorophosphate, 0.0195 g 9,10-diethoxyanthracene, and 4.4 ml MEK. This formulation was coated onto an aluminum plate, dried at 85° C. for 5 min, exposed for 40 sec, swabbed with the hydrophilizing solution of Example 11, and hand inked to give an open 2 step.

The above coating solution was also coated with a #20 wire wound rod (0.046 mm wet thickness) onto primed polyester and dried at 85° C. for 5 min. A 20 sec exposure was followed by soaking in dye bath formulation 2 for 5 min to give a closed 7 step. The coating produced in this manner had a density of 3.07 in the exposed areas and a background of 0.09 in unexposed regions.

EXAMPLE 26

A coating formulation was prepared by combining 0.5 ml of the above solution of poly(tetrahydropyran-2-yl methacrylate) (30 wt % solution in MEK), 1.5 ml of Gantrez TM AN-139 (10 wt % solution in MEK), 0.078 g tristrichloromethyl triazine, 0.0195 g of 9,10-diethoxyanthracene, and 3.5 ml of MEK.

This formulation was coated with a #12 wire wound rod (0.027 mm wet thickness) on aluminum plates, dried at 80° C. for 5 min, and exposed for 90 sec, swabbed with the MES hydrophilizing solution (Example 11) and hand inked to give an open 4 step.

The above coating formulation was also coated with a #20 wire wound rod on primed polyester and dried in an oven at 80° C. for 5 minutes. Exposures were for 120 seconds followed by soaking in dye bath formulation 2 for 5 minutes to give a closed 2 step.

EXAMPLE 27

A coating formulation was prepared by combining 0.5 ml of the above solution of poly(tetrahydropyran-2-yl methacrylate) (30 wt % solution in MEK), 1.5 ml of Gantrez TM AN-139 (10 wt % solution in MEK), 0.078 g triphenylsulfonium hexafluorophosphate, 0.0195 g of 9,10-diethoxyanthracene, and 3.5 ml of MEK.

This formulation was coated with a #12 wire wound rod (0.027 mm wet thickness) on aluminum plates, dried at 80° C. for 5 min, exposed for 10 sec, swabbed with 10% aqueous triethanolamine solution and hand inked to give an open 7 step.

The above coating formulation was also coated with a #20 wire wound rod (0.046 mm wet thickness) on primed polyester and dried in an oven at 80° C. for 5 minutes. Exposures were performed 10 seconds followed by soaking in dye bath formulation 2 for 5 minutes to give a closed 6 step.

EXAMPLE 28

A coating formulation was prepared by combining 0.5 mL of the above solution of poly(tetrahydropyran-2-yl methacrylate) (30 wt % solution in MEK), 1.5 mL of GANTREZ TM AN-139 (10 wt % solution in MEK), 0.078 g diphenyliodonium hexafluorophosphate, 0.0195 g of 9,10-diethoxyanthracene, and 3.5 mL of MEK.

This formulation was coated with a #12 wire-wound rod (0.027 mm wet thickness) onto aluminum plates, dried at 80° C. for 5 minutes, exposed for 10 seconds, swabbed with a 10% aqueous solution of triethanol amine that has been treated with 12 molar hydrochloric acid to a pH of 7, and hand inked to give an open 7 step.

EXAMPLE 29

The example demonstrates the use of ethyl violet to obtain a printout image after exposure, and to stabilize the non-imaged regions to white light (room light) exposure.

A coating formulation was prepared by combining 0.15 g of poly(tetrahydropyran-2-yl methacrylate), 0.15 g of GANTREZ TM AN-139, 0.078 g diphenyliodonium hexafluorophosphate, 0.0195 g of 9,10-diethoxyanthracene, 1.0 mL of ethyl violet solution (0.03 g in 10 mL of MEK) and 1.0 mL of MEK.

This formulation was coated with a #12 wire-wound rod onto aluminum plates, dried at 80° C. for 5 minutes, exposed for 5 seconds, swabbed with a 10% aqueous solution of triethanolamine that has been treated with 12 molar hydrochloric acid to a pH of 7, and hand inked to give an open 3 step.

A second sample prepared in this manner was imagewise exposed in a Berkey Ascor device for 5 seconds and then flood exposed to room lights for 1.25 hours. The sample was swabbed with a 10% aqueous solution of triethanolamine that has been treated with 12 molar hydrochloric acid to a pH of 7, and hank inked to give an open 3 step.

Coating solutions as described above are not stable at room temperature over a period of several days, however, if the GANTREZ TM resin is omitted from the coating solution and added just prior to coating, the solutions are stable.

EXAMPLE 30

This example illustrates the white light stability of a formulation utilizing 2-ethylanthracene and ethyl violet.

A coating formulation was coated with a #12 wire-wound rod onto aluminum plates, dried at 80° C. for 5 minutes, exposed for 50 seconds, swabbed with the hydrophilizing solution in example 11 and hand inked to give an open 8 step.

A second sample prepared in this manner was imagewise exposed in a Berkey Ascor device for 50 seconds and then flood exposed to room lights for 3.5 hours. The sample was hand inked in water to give an open 4 step.

EXAMPLE 31

This example illustrates the wash off system that is obtained when using an ammonium salt in the formulation.

A coating formulation was prepared by combining 0.30 g of poly(tetrahydropyran-2-yl methacrylate), 0.30 g of GANTREZ TM AN-139, 0.156 g di(dodecylphenyl)iodonium hexafluoroantimonate, 0.039 g of 9,10-diethoxyanthracene, 0.05 g of tetrabutylammonium chloride 1.0 mL of ethyl violet solution (0.03 g in 10 mL of MEK), and 3.0 mL of MEK.

This formulation was coated with a #12 wire-wound rod onto aluminum plates, dried at 80° C. for 5 minutes, exposed for 60 seconds, swabbed with a 10% aqueous solution of triethanol amine that has been treated with 12 molar hydrochloric acid to a pH of 7. At this point the coating in the background came off the produce a clean aluminum surface. Hand inking gave an open 4 step.

EXAMPLE 32

The example illustrates a wash off system with diallylpiperidinium bromide and ethyl violet that remains stable after extended white light exposure (at least 90 h).

A coating formulation was prepared by combining 1.0 mL of poly(tetrahydropyran-2-yl methacrylate) (30 wt % solution in MEK), 3.0 mL of GANTREZ TM AN-139 (10 wt % solution in MEK), 0.078 g of di(dodecylphenyl)iodonium hexafluoroantimonate, 0.039 g of 9,10-diethoxyanthracene, 0.01 g of diallylpiperidimium bromide and 1.0 mL of ethyl violet solution (0.03 g in 10 mL of MEK).

This formulation was coated with a #12 wire-wound rod onto aluminum plates, dried at 80° C. for 5 minutes, exposed for 60 seconds, swabbed with a 10% aqueous solution of triethanol amine that has been treated with 12 molar hydrochloric acid to a pH of 7. At this point the coating in the background came off the produce a clean aluminum surface. The sample was then flood exposed with room light for 90 hours and hand inked to give an open 5 step.

EXAMPLE 33

This example illustrates a system that does not wash off but utilizes an ammonium salt to generate a stable image by a postheating step.

A sample prepared as described in example 32 was exposed for 60 seconds and then heated to 120° C. for 10 minutes and then flood exposed with room light for 12 h. The sample was either swabbed with water or a 10% aqueous solution of triethanol amine that has been treated with 12 molar hydrochloric acid to a pH of 7, and hand inked to give an open 4 step. In this instance the background coating did not come off on swabbing.

EXAMPLE 34

This example illustrates a second example similar to example 32 with a different ammonium salt.

A sample was prepared as described in example 32 except diallylpiperidinium bromide was replaced by methyltriallylammonium bromide. The sample was exposed for 60 seconds, swabbed with a 10% aqueous solution of triethanol amine that has been treated with 12 molar hydrochloric acid to a pH of 7. At this point the coating in the background came off and produce a clean aluminum surface. The sample was then flood exposed with room light for 90 hours and hand inked to give an open 5 step.

Reasonable variations and modifications are possible from the foregoing disclosure without departing from either the spirit or scope of the present invention as defined in the claims.

We claim:

1. A process for forming an imaged article comprising exposing an imageable article comprising a photosensitive composition coated on a substrate, said photosensitive composition comprising:
   (a) a photoinitiator which generates an acid upon exposure to radiation; and
   (b) a polymer having acid labile groups pendant from the polymer backbone, said acid labile pendant groups being represented by the following formula:

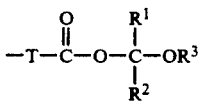

wherein:
   $R^1$ and $R^2$ each represent hydrogen or a $C_1$ to $C_{18}$ alkyl group with the proviso that at least one of $R^1$ and $R^2$ must be hydrogen; $R^3$ represents a $C_1$ to $C_{18}$ alkyl group; or any two of $R^1$, $R^2$, and $R^3$ together form a substituted or unsubstituted ring containing from 2 to 36 carbon atoms; and T represents a divalent linking group connected to the polymer backbone and contains a total of from 0 to about 18 carbon atoms where up to one of each three carbon atoms can be replaced with nitrogen, oxygen, or sulfur atoms, or combinations thereof, to radiation within a range absorbed by said photoinitiator to form a latent image bearing article, and applying ink to said latent image bearing article, thereby forming an imaged article.

2. A process for forming an imaged article comprising the steps of:
   (a) exposing an imageable article comprising a photoinitiator which generates an acid upon exposure to radiation; and a polymer having acid labile groups pendant from the polymer backbone, said acid labile pendant groups being represented by the following formula:

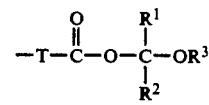

wherein:
   $R^1$ and $R^2$ each represent hydrogen or a $C_1$ to $C_{18}$ alkyl group with the proviso that at least one of $R^1$ and $R^2$ must be hydrogen; $R^3$ represents a $C_1$ to $C_{18}$ alkyl group; or any two of $R^1$, $R^2$, and $R^3$ together form a substituted or unsubstituted ring containing from 2 to 36 carbon atoms; and T represents a divalent linking group connected to the polymer backbone and contains a total of from 0 to about 18 carbon atoms where up to one of each three carbon atoms can be replaced with nitrogen, oxygen, or sulfur atoms, or combinations thereof, to radiation within a range absorbed by said photoinitiator to form a latent image bearing article, and applying ink to said latent image bearing article, thereby forming an imaged article, to radiation within a range absorbed by said photoinitiator thereby forming a first latent image bearing article;
   (b) contacting said first latent image bearing article with a hydrophilizing agent to form a second latent image bearing article; and
   (c) applying ink to said second latent image bearing article to form an imaged article.

3. An imaged article made according to the process of claim 2.

4. A process for forming an imaged article comprising: exposing an imageable article comprising a photoinitiator which generates an acid upon exposure to radiation; and a polymer having acid labile groups pendant from the polymer backbone, said acid labile pendant groups being represented by the following formula:

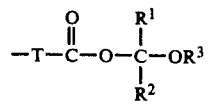

wherein:
   $R^1$ and $R^2$ each represent hydrogen or a $C_1$ to $C_{18}$ alkyl group with the proviso that at least one of $R^1$ and $R^2$ must be hydrogen; $R^3$ represents a $C_1$ to $C_{18}$ alkyl group; or any two of $R^1$, $R^2$, and $R^3$ together form a substituted or unsubstituted ring containing from 2 to 36 carbon atoms; and T represents a divalent linking group connected to the polymer backbone and contains a total of from 0 to about 18 carbon atoms where up to one of each three carbon atoms can be replaced with nitrogen, oxygen, or sulfur atoms, or combinations thereof, to radiation within a range absorbed by said photoinitiator to form a latent image bearing article, and applying ink to said latent image bearing article, thereby forming an imaged article, to radiation within a range absorbed by said photoinitiator to form a latent image bearing article, and contacting said latent image bearing article with a dye solution to form an imaged article.

5. An imaged article made according to the process of claim 4.

6. A process for forming an imaged article comprising the steps of:
(a) exposing an imageable article comprising a photoinitiator which generates an acid upon exposure to radiation; and a polymer having acid labile groups pendant from the polymer backbone, said acid labile pendant groups being represented by the following formula;

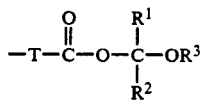

wherein:

$R^1$ and $R^2$ each represent hydrogen or a $C_1$ to $C_{18}$ alkyl group with the proviso that at least one of $R^1$ and $R^2$ must be hydrogen; $R^3$ represents a $C_1$ to $C_{18}$ alkyl group; or any two of $R^1$, $R^2$, and $R^3$ together form a substituted or unsubstituted ring containing from 2 to 36 carbon atoms; and T represents a divalent linking group connected to the polymer backbone and contains a total of from 0 to about 18 carbon atoms where up to one of each three carbon atoms can be replaced with nitrogen, oxygen, or sulfur atoms, or combinations thereof, to radiation within a range absorbed by said photoinitiator to form a latent image bearing article, and applying ink to said latent image bearing article, thereby forming an imaged article, to radiation within a range absorbed by said photoinitiator thereby forming a first latent image bearing article;

(b) contacting said first latent image bearing article with a hydrophilizing agent to form a second latent image bearing article; and (c) contacting said second latent image bearing article with a dye solution to form an imaged article.

7. An imaged article made according to the process of claim 6.

8. A process for forming and fixing an imaged article comprising the steps of:
(a) exposing an imageable article comprising a photoinitiator which generates an acid upon exposure to radiation; and a polymer having acid labile groups pendant from the polymer backbone, said acid labile pendant groups being represented by the following formula:

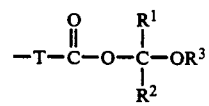

wherein:

$R^1$ and $R^2$ each represent hydrogen or a $C_1$ to $C_{18}$ alkyl group with the proviso that at least one of $R^1$ and $R^2$ must be hydrogen; $R^3$ represents a $C_1$ to $C_{18}$ alkyl group; or any two of $R^1$, $R^2$, and $R^3$ together form a substituted or unsubstituted ring containing from 2 to 36 carbon atoms; and T represents a divalent linking group connected to the polymer backbone and contains a total of from 0 to about 18 carbon atoms where up to one of each three carbon atoms can be replaced with nitrogen, oxygen, or sulfur atoms, or combinations thereof, to radiation within a range absorbed by said photoinitiator to form a latent image bearing article, and applying ink to said latent image bearing article, thereby forming an imaged article, to radiation within a range absorbed by said photoinitiator to form a first latent image bearing article;

(b) heating said first latent image bearing article to a temperature greater than about 100° C. to form a second latent image bearing article;

(c) cooling said heated latent image bearing article to below 40° C. to form third latent image bearing article;

(d) exposing said modified latent image bearing article to white light to form a fourth latent image bearing image article;

(e) contacting a fourth latent image bearing article with hydrophilizing agent to form a fifth latent image bearing article; and (f) applying ink to said fifth latent image bearing article to form an imaged article.

9. An imaged article made according to the process of claim 8.

* * * * *